United States Patent
Matsushita et al.

(10) Patent No.: US 7,138,641 B2
(45) Date of Patent: Nov. 21, 2006

(54) BEAM DEFLECTING METHOD, BEAM DEFLECTOR FOR SCANNING, ION IMPLANTATION METHOD, AND ION IMPLANTATION SYSTEM

(75) Inventors: Hiroshi Matsushita, Ehime (JP); Mitsuaki Kabasawa, Ehime (JP); Yoshitaka Amano, Ehime (JP); Yasuhiko Kimura, Ehime (JP); Mitsukuni Tsukihara, Ehime (JP); Junichi Murakami, Ehime (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 0 days.

(21) Appl. No.: 11/139,490

(22) Filed: May 31, 2005

(65) Prior Publication Data
US 2006/0113490 A1 Jun. 1, 2006

(30) Foreign Application Priority Data
Nov. 30, 2004 (JP) .............................. 2004-347298

(51) Int. Cl.
G01N 23/00 (2006.01)
G21K 7/00 (2006.01)
G21G 5/00 (2006.01)

(52) U.S. Cl. .................. 250/396 R; 250/306; 250/307; 250/310; 250/311; 250/492.1; 250/492.2; 250/492.3; 250/492.21; 250/492.22; 250/492.23

(58) Field of Classification Search ................ 250/306, 250/307, 310, 311, 492.1–492.3, 492.21–492.23
See application file for complete search history.

(56) References Cited

U.S. PATENT DOCUMENTS

| | | | |
|---|---|---|---|
| 5,041,731 A * | 8/1991 | Oae et al. ............ | 250/396 ML |
| 5,981,961 A | 11/1999 | Edwards et al. | |
| 6,075,249 A | 6/2000 | Olson | |
| 6,521,895 B1 | 2/2003 | Walther | |
| 6,777,696 B1 | 8/2004 | Rathmell | |
| 6,855,929 B1 * | 2/2005 | Kimba et al. ............... | 250/310 |
| 2002/0003215 A1 | 1/2002 | Berrian | |
| 2002/0028399 A1 * | 3/2002 | Nakasuji et al. ............. | 430/30 |
| 2002/0036264 A1 * | 3/2002 | Nakasuji et al. ............ | 250/306 |
| 2002/0148975 A1 * | 10/2002 | Kimba et al. ............ | 250/492.1 |
| 2003/0030008 A1 | 2/2003 | Sobukawa et al. | |
| 2005/0092921 A1 * | 5/2005 | Nakasuji et al. ............ | 250/306 |
| 2005/0104013 A1 * | 5/2005 | Stengl et al. .......... | 250/492.21 |
| 2005/0121611 A1 * | 6/2005 | Kimba et al. ............... | 250/311 |

FOREIGN PATENT DOCUMENTS

| | | |
|---|---|---|
| JP | 61-142646 | 6/1986 |
| JP | 10-64470 | 3/1998 |
| JP | 2003-513419 A | 4/2003 |

OTHER PUBLICATIONS

Olson J C et al., "Scanned beam uniformity control in the VIISta 810 ion implanter", Ion Implantation Technology Proceedings, 1998 International Conference on Kyoto, JAPAN, Jun. 22, 1998, PP. 22-26, vol. 1, Piscataway, NJ.
US 7,041,992, 05/2006, Stengl et al. (withdrawn)*

* cited by examiner

*Primary Examiner*—Nikita Wells
*Assistant Examiner*—Bernard E. Souw
(74) *Attorney, Agent, or Firm*—Arent Fox PLLC

(57) ABSTRACT

A beam deflector for scanning performs deflecting of a charged particle beam having a regular trajectory in a vacuum space to thereby periodically change the trajectory of the charged particle beam. The beam deflector comprises a pair of deflection electrodes disposed so as to confront each inner electrode surface having a symmetrical concave extending in a direction of a beam trajectory.

39 Claims, 11 Drawing Sheets

BEAM DEFLECTING METHOD, BEAM DEFLECTOR FOR SCANNING, ION IMPLANTATION METHOD, AND ION IMPLANTATION SYSTEM

This application claims priority to prior Japanese patent application JP 2004-347298, the disclosure of which is incorporated herein by reference.

BACKGROUND OF THE INVENTION

This invention relates to a deflecting method for scanning and a deflector for deflecting a charged particle beam such as an ion beam with scanning. This invention particularly relates to a deflecting method and a deflector suitable for deflecting a charged particle beam with a relatively large current or a charged particle beam with a relatively large diameter. The charged particle beam with the relatively large diameter represents, for example, a charged particle beam having a flattened cross-sectional shape in which its horizontal width is greater than its vertical width. Note that "horizontal" which will hereinafter be referred to represents one axis in a plane in a direction perpendicular to a center axis of a beam trajectory and does not necessarily represent a horizontal axis. Likewise, "vertical" represents one axis in the plane in the direction perpendicular to the center axis of the beam trajectory and does not necessarily represent a perpendicular or vertical axis, and specifically represents the axis that is perpendicular to the foregoing axis of the horizontal direction in the plane in the direction perpendicular to the center axis of the beam trajectory. This invention is suitable for application to an ion implantation method and an ion implantation system but is not limited thereto.

Description will be briefly given about a structure of the ion implantation system. In this specification, an ion beam falls under the category of a charged particle beam and the charged particle beam may hereinafter be referred to simply as a "beam".

As is well known, in the ion implantation system, a beam is extracted from an ion source through an extraction electrode. The extracted beam is analyzed by a mass analysis electromagnet device and a mass analysis slit. As a result of the mass analysis, only a necessary ion species is selected. The selected ion is implanted into a substrate such as a silicon wafer.

Normally, the ion implantation system is provided with a deflector for deflecting the beam in order to scan the surface of the substrate with the beam. Deflectors of this type include a magnetic deflector and an electrostatic (electrical field) deflector. Description will be briefly given about structures, merits and demerits of the magnetic deflector and the electrostatic deflector.

The magnetic deflector comprises an electromagnet composed of at least two magnetic pole pieces confronting each other through a gap defined therebetween and a coil. A current supplied to the coil generates in the gap a magnetic field that deflects the beam. By changing the current supplied to the coil, the beam passing through the gap is magnetically deflected. The magnetic deflector has a merit of facilitating uniform generation and distribution of a magnetic field over a wide region as compared with the electrostatic deflector. However, the magnetic deflector has a demerit that a structure thereof tends to be large and complicated and further the power consumption thereof is large. In addition, the magnetic deflector also has a demerit that the magnetic field tends to leak and, as a scanning frequency increases, it becomes more difficult to generate the magnetic field. Moreover, in the magnetic deflector, there is an instant when a deflection angle of the beam becomes zero (i.e. the beam goes straight on) and, in this instant, the magnetic field disappears. While the magnetic field disappears, secondary electrons neutralizing the beam are dispersed so that a diameter of the beam increases. As a result, the beam diameter differs between when the deflection angle is zero and when the deflection angle is other than zero.

On the other hand, the electrostatic deflector comprises at least two opposite electrodes confronting each other through a gap defined therebetween. A scanning voltage is applied across the two opposite electrodes. The scanning voltage generates in the gap an electrical field that deflects a beam passing through the gap. By changing the scanning voltage, the beam passing through the gap is electrostatically deflected (e.g. see JP-A-2003-513419). The electrostatic deflector has a merit that it can be more compact in structure and requires less power consumption as compared with the magnetic deflector. However, the electrostatic deflector has a demerit that a uniform electrical field is difficult to generate and the beam after deflection is inferior in quality as compared with that in the magnetic deflector.

Incidentally, in the deflection of the beam, when a beam current is large or the beam has a flattened cross-sectional shape, i.e. a cross-sectional shape that is horizontally elongated, it is difficult for the conventional electrostatic deflector to cope with it and, therefore, improvement in performance of the deflector is essential.

Specifically, when a beam having a horizontally elongated cross-sectional shape is deflected in its major-axis direction (horizontal-width direction), it is required that the beam be deflected at substantially the same deflection angle at any portions of the cross-section of the beam. Note that even if variation in deflection angle occurs in the deflection of the beam, it is assumed that no problem is raised when the variation is sufficiently small or can be easily corrected.

SUMMARY OF THE INVENTION

It is an object of this invention to realize an electrostatic deflector that is practical and compact and that scans a large-diameter or large-current beam without defocus thereof.

According to a first aspect of the invention, a beam deflector for scanning is provided. The beam deflector performs deflecting of a charged particle beam having a regular trajectory in a vacuum space to thereby periodically change the trajectory of the charged particle beam. The beam deflector comprises a pair of deflection electrodes disposed so as to confront each inner electrode surface having a symmetrical concave extending in a direction of a beam trajectory.

In the beam deflector of the first aspect, it is preferable that a cross-sectional shape of the concave is a substantially circular-arc concave shape or a polygonal concave shape.

In the beam deflector of the first aspect, the cross-sectional shape of the concave may change linearly or in steps along a center axis of the beam trajectory.

In the beam deflector in the first aspect, it is preferable that inner electrode surfaces in the confronting direction of the pair of deflection electrodes are bent along maximum scan trajectories of a center axis of the beam trajectory so as to be substantially parallel to the maximum scan trajectories.

In the beam deflector of the first aspect, it is preferable that the pair of deflection electrodes are applied with ac voltages having the same phase and reverse polarity, ac voltages in the form of triangular waves having the same phase and reverse polarity, or ac voltages approximate to triangular waves having the same phase and reverse polarity.

In the beam deflector of the first aspect, the pair of deflection electrodes may be applied with ac voltages having the same values, the same phase, and reverse polarity.

In the beam deflector of the first aspect, dc components may be superimposed on the ac voltages.

In the beam deflector of the first aspect, each of the pair of deflection electrodes may be formed by a plurality of individual members that are divided in the direction of a center axis of the beam trajectory.

According to a second aspect of the invention, an ion implantation system comprising the beam deflector for scanning according to the first aspect is provided.

According to a third aspect of the invention, a beam deflecting method for scanning is provided. The beam deflecting method performs, by a beam deflector for scanning, deflecting of a charged particle beam having a regular trajectory in a vacuum space to thereby periodically change the trajectory of the charged particle beam. The beam deflecting method comprises the steps of preparing, as the beam deflector for scanning, a pair of deflection electrodes confronted each inner electrode surface having a symmetrical concave extending in a direction of a center axis of a beam trajectory, and applying a uniform electrical field generated by the pair of deflection electrodes to the charged particle beam passing through a space defined between the pair of deflection electrodes, thereby performing the deflection for scanning.

In the beam deflecting method of the third aspect, it is preferable that the pair of deflection electrodes have shapes that form an electrical field so that an electrical field distribution in a beam horizontal-width direction becomes uniform at any positions in a beam advancing direction between the pair of deflection electrodes.

According to a fourth aspect of the invention, a beam deflecting method for scanning is provided. The beam deflecting method performs, by beam deflector for scanning, deflecting of a charged particle beam having a regular trajectory in a vacuum space to thereby periodically change the trajectory of the charged particle beam. The beam deflecting method comprises the step of preparing, as the beam deflector for scanning, a pair of deflection electrodes confronted each inner electrode surface having a symmetrical concave extending in a direction of a center axis of a beam trajectory. The beam deflecting method further comprises the step of causing the charged particle beam having an oval cross-sectional shape in which a horizontal width of the oval beam parallel to a confronting direction of the pair of deflection electrodes is greater than a vertical width of the oval beam perpendicular to the confronting direction, and the oval beam being incident upon an inlet side of the pair of deflection electrodes of the beam deflector for scanning. The beam deflecting method still further comprises the step of applying a periodic deflection action for scanning in the confronting direction of the deflection electrodes.

In the beam deflecting method of the fourth aspect, it is preferable that an electrical field generated by the pair of deflection electrodes is uniformly distributed so that the charged particle beam having the oval cross-sectional shape is deflected at substantially the same deflection angle at any portions with respect to a cross-section thereof.

In the beam deflecting method of the fourth aspect, it is preferable that, in a space between the pair of deflection electrodes, a change in beam profile is made as small as possible and orderly with respect to the deflection angle.

According to a fifth aspect of the invention a beam deflecting method for scanning is provided. The beam deflecting method performs deflecting of a charged particle beam having a regular trajectory in a vacuum space to thereby periodically change the trajectory of the charged particle beam. The beam deflecting method comprises the steps of deflecting the charged particle beam for scanning in one scanning direction by the use of a pair of deflection electrodes disposed so as to confront each inner electrode surface having a symmetrical concave extending in a direction of a center axis of a beam trajectory, and mechanically moving a substrate, implanted with the charged particle beam, in a direction perpendicular to the one scanning direction to thereby perform ion implantation.

According to a sixth aspect of the invention, an ion implantation method using the beam deflecting method for scanning according to any one of the third to fifth aspects.

According to a seventh aspect of the invention, a beam deflector for scanning performs deflecting of a charged particle beam having a regular trajectory in a vacuum space to thereby periodically change the trajectory of the charged particle beam. In the beam deflector of the seventh aspect comprises a pair of deflection electrodes disposed so as to confront each inner electrode surface. The each inner electrode surface has a symmetrical concave extending in a direction of a center axis of a beam trajectory. In order to be applied a uniform electrical field zone by the deflection electrodes to the charged particle beam, an inlet side of the pair of deflection electrodes having wide electrode distance between innermost-side ends of confronting portions, and the electrode distance are set much greater than a horizontal width of the incident charged particle beam.

In the beam deflector of the seventh aspect, it is preferable that shield electrodes each having an opening for beam passing are disposed adjacent to the pair of deflection electrodes on upstream and downstream sides thereof, respectively.

In the beam deflector of the seventh aspect, the shield electrodes disposed on each of the upstream and downstream sides may have plural electrodes, respectively.

In the beam deflector of the seventh aspect, each of the shield electrodes may be independently applied with a fixed or variable voltage.

In the beam deflector of the seventh aspect, the single shield electrode may be disposed on each of the upstream and downstream sides of the pair of deflection electrodes and each of the shield electrodes may be grounded.

In the beam deflector of the seventh aspect, the two shield electrodes may be disposed on each of the upstream and downstream sides of the pair of deflection electrodes. In this case, one of the two shield electrodes on the upstream side, which is located closer to the pair of deflection electrodes, and one of the two shield electrodes on the downstream side, which is located closer to the pair of deflection electrodes, are applied with a dc voltage of about −1 kV to −2 kV so as to serve as electron suppression electrodes. The other of the two shield electrodes on the upstream side and the other of the two shield electrodes on the downstream side are grounded so as to serve as ground electrodes.

In the beam deflector of the seventh aspect, it is preferable that each of the openings of the suppression and ground electrodes is formed into a rectangular shape with a large aspect ratio which is large in a direction of a horizontal beam width while one size larger than a vertical beam width in a direction of the vertical beam width so as to well suppress an electrical field.

In the beam deflector of the seventh aspect, the suppression and ground electrodes cause the electrical field to be weak in the direction of the horizontal beam width and have no effect on the trajectory (deflection angle) of the charged particle beam.

In the beam deflector of the seventh aspect, the opening of each of the shield electrodes on the upstream and downstream sides is configured such that a width thereof in a direction of a horizontal beam width is sufficiently greater than the horizontal beam width to thereby prevent the charged particle beam from passing near edges of the opening in the direction of the horizontal beam width.

In the beam deflector of the seventh aspect, by determining a shape and size of each of the concave of the pair of deflection electrodes so that electrical fields in a direction perpendicular to a beam deflection plane near the shield electrodes and electrical fields in the direction perpendicular to the beam deflection plane within the beam deflector for scanning is canceled each other, consequently focus/defocus and trajectory declination of the charged particle beam in the direction perpendicular to the beam deflection plane before and after passing through the beam deflector is made small.

In the beam deflector of the seventh aspect, by causing an electrical field in a direction perpendicular to a beam deflection plane at a center portion in the beam deflector for scanning to be slightly stronger than electrical fields in the other regions, consequently a beam profile after passing through the beam deflector for scanning is made excellent.

In the beam deflector of the seventh aspect, each of the pair of deflection electrodes may be formed by a plurality of individual members that are divided in the direction of the center axis of the beam trajectory.

According to an eighth aspect of the invention, an ion implantation system comprising the beam deflector for scanning according to the seventh aspect is provided.

In the ion implantation system according to the second and the eighth aspects, the pair of deflection electrodes are disposed in a housing having openings for beam passing. The housing is configured to be freely putting on and taking off for a beam line in a midway of the beam line.

In the ion implantation system according to the second and the eighth aspects, a rack is arranged in the midway of the beam line. A beam guide box having beam passing openings and being larger than the housing is mounted on the rack. The housing is movable along a rail disposed in the beam guide box so that the housing is allowed to be received into and taken out from the beam guide box.

In the ion implantation system according to the second and the eighth aspects, the rail extends in a direction perpendicular to an extending direction of the beam line and a door for allowing the housing to be received into and taken out from the beam guide box is provided on one side of the beam guide box near one end of the rail.

In the ion implantation system according to the second and the eighth aspects, the housing is provided with a plurality of terminals having a feedthrough structure for establishing connection between at least the pair of deflection electrodes and a power supply.

In the ion implantation system according to the second and the eighth aspects, an outlet connected to an evacuator is provided in the housing.

BRIEF DESCRIPTION OF THE DRAWING

FIGS. 1A and 1B are diagrams for explaining a schematic structure of an ion implantation system applied with this invention, wherein FIG. 1A is a plan view and FIG. 1B is a side view of FIG. 1A;

FIGS. 4A and 4B are diagrams each for explaining electric lines of force and electrical fields generated by two deflection electrodes, wherein FIG. 4A shows the electric lines of force and the electrical fields generated by the conventional two deflection electrodes, while FIG. 4B shows the electric lines of force and the electrical fields generated by the two deflection electrodes of this invention;

FIGS. 6A to 6C are diagrams for explaining electrical fields generated by the two deflection electrodes, wherein FIG. 6A is a diagram for explaining the electrical fields generated by the conventional deflection electrodes, FIG. 6B is a diagram for explaining the electrical fields generated by the deflection electrodes of this invention, while FIG. 6C is a diagram for explaining the electrical fields caused by the upstream shield electrode and a downstream shield electrode in this invention;

FIGS. 10A to 10C are diagrams for explaining still other examples of two deflection electrodes according to this invention, wherein FIG. 10A is a diagram showing another example of a cross-sectional shape of a concave formed on each of the deflection electrodes, FIG. 10B is a diagram showing still another example of a cross-sectional shape of a concave formed on each of the deflection electrodes, and FIG. 10C is a transverse sectional view showing one example in which each of the deflection electrodes is formed by individual members;

DESCRIPTION OF THE PREFERRED EMBODIMENT

Figure 1A:
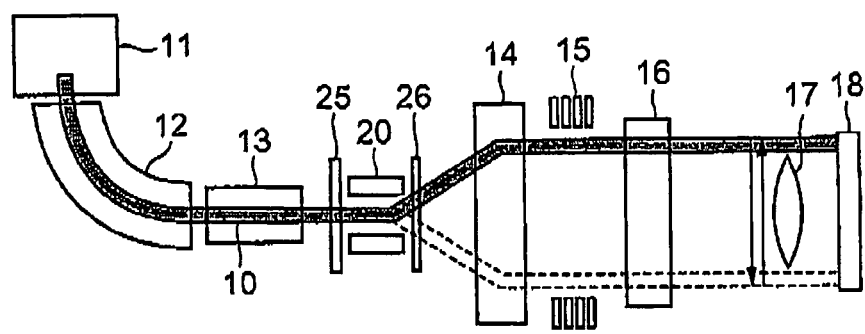
Figure 1B:
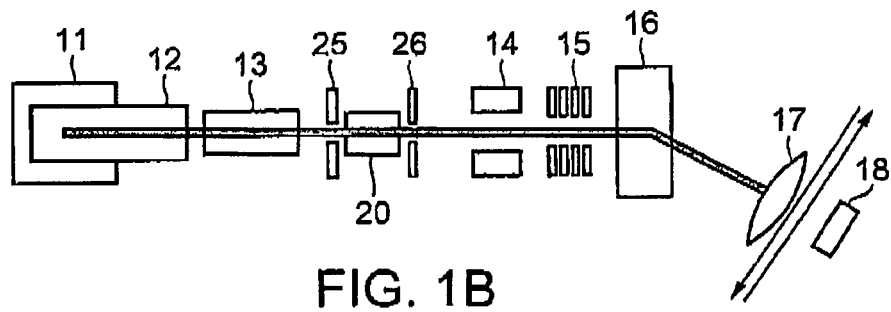

Referring to FIGS. 1A and 1B, description will be given about an embodiment wherein this invention is applied particularly to a single-wafer ion implantation system among those processing systems using charged particle beams. FIG. 1A is a plan view showing a schematic structure of the single-wafer ion implantation system, while FIG. 1B is a side view of FIG. 1A.

In FIGS. 1A and 1B, ions generated in an ion source 11 are extracted through an extraction electrode (not illustrated) as an ion beam (hereinafter referred to as a "beam"). The extracted beam is analyzed by a mass analysis electromagnet device 12 so that only a necessary ion species is selected. The beam composed of the selected ion is shaped into a beam having a required cross-sectional shape by a beam shaper 13. The beam shaper 13 is formed by a Q (Quadrupole)-lens and so on. The beam having a regular trajectory and the shaped cross-section is deflected in a direction parallel to the sheet surface of FIG. 1A by a deflector 20 for scanning according to this invention. The deflector 20 has shield electrodes 25 and 26 disposed on the upstream and downstream sides thereof, respectively. The deflector 20 and the shield electrodes 25 and 26 will be described in detail later.

The deflected beam is parallelized again by a P (Parallel)-lens 14 so as to be parallel to an axis of a deflection angle of 0 degree. In FIG. 1A, a scan range of the beam 10 by the deflector 20 is indicated by a thick black line and broken lines. The thick black line and the broken lines extending from the deflector 20 can be defined as the maximum scan trajectories, respectively. The beam from the P-lens 14 is sent to an azimuthal energy filter 16 through one or more acceleration/deceleration electrodes 15. The azimuthal energy filter 16 performs analysis about energy of the beam to thereby select only an ion species with a necessary energy. As shown in FIG. 1B, only the selected ion species is deflected slightly downward in the azimuthal energy filter 16. A semiconductor wafer 17 being a to-be-implanted object is irradiated by the beam composed of only the thus selected ion species. The beam that is not implanted to the semiconductor wafer 17 is incident on a beam stopper 18 so that energy thereof is consumed. Normally, the structure from the ion source 11 to a chamber (not illustrated) where the semiconductor wafer 17 is accommodated is called a beam line. A transportation path of the beam is all maintained in a high-vacuum state and sealed from the air.

In FIG. 1A, two arrows shown adjacent to the semiconductor wafer 17 represent that the beam is deflected in directions of these arrows. In FIG. 1B, two arrows shown adjacent to the semiconductor wafer 17 represent that the semiconductor wafer 17 is reciprocated in directions of these arrows, i.e. mechanically moved. Specifically, assuming that the beam is reciprocatingly deflected in directions of one axis, the semiconductor wafer 17 is reciprocated in directions perpendicular to such directions of one-axis.

Figure 2:
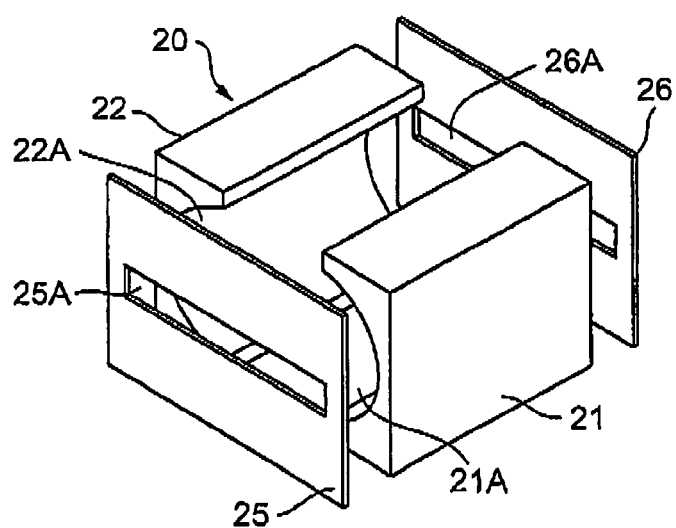
FIG. 2 is a perspective view showing a basic structure of a deflector according to an embodiment of this invention.
Figure 3:
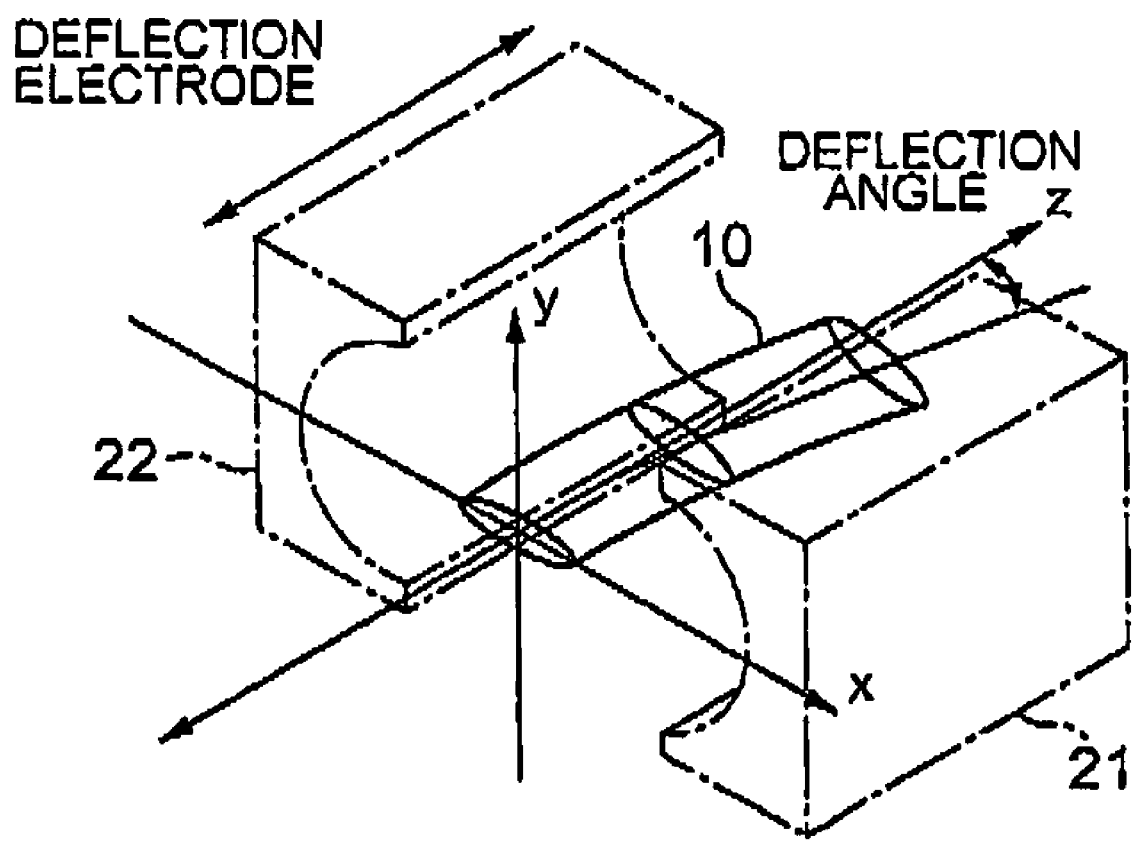
FIG. 3 is a diagram for showing a relationship among x-, y-, and z-axes with respect to the deflector according to this invention.

FIG. 2 is a perspective view showing a basic structure of the deflector according to the embodiment of this invention. FIG. 3 is a diagram for showing a relationship among x-, y-, and z-axes which will be explained hereinbelow with respect to the deflector according to the embodiment of this invention. The deflector 20 comprises a pair of deflection electrodes 21 and 22 arranged so as to confront each other with the beam interposed therebetween. Note that the arrangement shown in FIG. 2 is only one example. That is, the arrangement of the deflection electrodes 21 and 22 is not limited to the illustrated manner in which the deflection electrodes 21 and 22 are disposed so as to confront each other in the horizontal direction, i.e. in the x-axis direction in this case. For example, the deflection electrodes 21 and 22 may be disposed so as to confront each other in the y-axis direction. The shield electrode 25 and the shield electrode 26 are disposed near the deflection electrodes 21 and 22 on their upstream and downstream sides, respectively. Note that the upstream and downstream shield electrodes 25 and 26 do not necessarily have the same shape.

The deflection electrodes 21 and 22 are symmetrical in shape with respect to the z-axis and are disposed so that their inner electrode surfaces on the z-axis side become symmetrical with respect to the z-axis. On the surfaces of the deflection electrodes 21 and 22 on the z-axis side, concaves 21A and 22A each having a substantially circular-arc shape in cross-section are formed so as to each extend in the z-axis direction.

As shown in FIG. 3, assuming that an initial beam advances in the z-axis direction and the deflection electrodes 21 and 22 are arranged symmetrically with respect to the y-z plane, the beam 10 is deflected in the z-x plane. The beam 10 has a flattened cross-sectional shape in which the width in the x-axis direction is greater than the width in the y-axis direction. Hereinafter, the width in the y-axis direction may be referred to as a "vertical width", while the width in the x-axis direction may be referred to as a "horizontal width". Further, the z-x plane may be referred to as a "beam deflection plane".

The shield electrodes 25 and 26 serve to prevent electrical fields generated by the deflection electrodes 21 and 22 from leaking to the beam trajectory outside the deflector 20. The shield electrodes 25 and 26 have openings 25A and 26A, respectively, and the beam passes through these openings 25A and 26A.

Figure 4A:
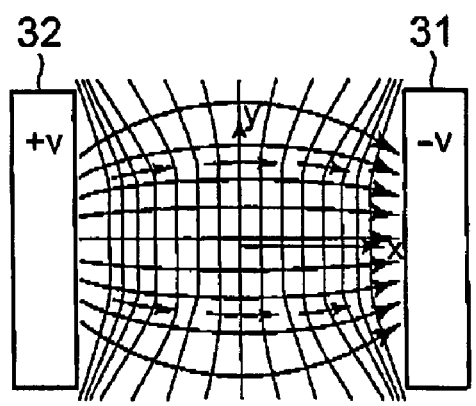
Figure 4B:
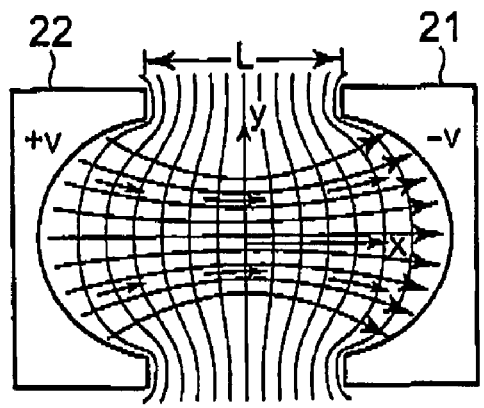

FIG. 4A shows electric lines of force and electrical fields generated by conventional deflection electrodes 31 and 32 each having a planar surface on the z-axis side. On the other hand, FIG. 4B shows electric lines of force and electrical fields generated by the deflection electrodes 21 and 22 of this invention having on their surfaces on the z-axis side the concaves 21A and 22A each extending in the z-axis direction and each having the substantially circular-arc shape in cross-section. In FIG. 4B, let a shortest distance L between the confronting surfaces of the deflection electrodes 21 and 22 be defined as a distance between innermost-side ends of both electrode portions. It is assumed that, in each of FIGS. 4A and 4B, a negative voltage −V is applied to the deflection electrode on the right side in the figure and a positive voltage +V is applied to the deflection electrode on the left side in the figure. Further, in each of the figures, lines extending in a leftward/rightward direction represent electric lines of force, lines extending in an upward/downward direction represent equipotential lines, while thick-line arrows represent electrical fields.

Hereinbelow, a comparison will be made between the deflection electrodes 31 and 32 of FIG. 4A (referred to as a "conventional type") and the deflection electrodes 21 and 22 of FIG. 4B (referred to as an "invention type").

At first, x-axis direction electrical fields will be examined.

In the conventional type, since the confronting surfaces on the beam side of the deflection electrodes 31 and 32 are planar in shape and the diameter (horizontal width) of the beam is relatively small, it is appropriate to consider that deflection electrical fields (x-axis direction electrical fields) of substantially the same strength are exerted on any cross-sectional portions of the beam.

On the other hand, in the invention type, the concaves 21A and 22A are formed on the confronting surfaces on the z-axis side of the deflection electrodes 21 and 22. The concaves 21A and 22A are symmetrical in shape with respect to the z-axis. In this case, electric lines of force are collected near the z-axis and electrical field components in the x-axis direction become nearly uniform near the z-axis.

As obvious from FIG. 4A, in the conventional type, electric lines of force largely expand in the y-axis direction so that the electrical field in the x-axis direction (deflection electrical field) becomes the weakest at x=0 while becomes stronger as going leftward or rightward.

On the other hand, in the invention type, the directivity of electric lines of force around x=0 changes depending on a radius of each of the concaves 21A and 22A, a depth thereof, the distance L between the deflection electrodes 21 and 22, and so on. From the structural point of view, when the size of each of the concaves 21A and 22A is sufficiently large, the deflection electrical field becomes stronger as approaching x=0, while, as the contribution of the concaves 21A and 22A decreases, the deflection electrical field becomes weaker as approaching x=0. Practically, in order to deflect (bend) a beam having a flattened cross-sectional shape, i.e. having a large horizontal width, uniformly at the same angle, it is preferable that the deflection electrical field be somewhat strengthened at x=0.

With respect to the shield electrodes 25 and 26 on the upstream and downstream sides of the deflection electrodes 21 and 22, the width in the x-axis (leftward/rightward) direction of each of the openings 25A and 26A is set sufficiently greater than the horizontal width of the beam so as to prevent the beam from passing near left and right edges of each of the openings 25A and 26A. This is because the electrical field is locally strengthened near the edges so that only a portion of the beam is irregularly bent.

Figure 5:
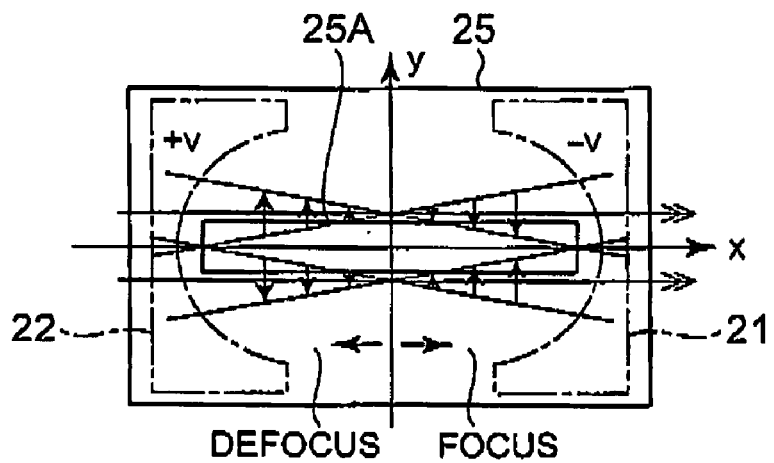
FIG. 5 is a diagram showing y-axis components of electrical fields near an opening of an upstream shield electrode in the deflector according to this invention.

Referring now to FIG. 5, y-axis direction electrical fields will be examined. FIG. 5 is a diagram showing y-axis components of electrical fields near the opening of the shield electrode, herein, near the opening 25A of the upstream shield electrode 25. It may be considered that the same applies to the case of the downstream shield electrode 26.

The electrical fields in the y-axis direction differ in a region near the shield electrode 25 and in a region sufficiently remote from the shield electrode 25. Accordingly, consideration is made about the electrical fields in the y-axis direction by dividing a region into one near the shield electrode 25 and the other region. Note that when there are a plurality of shield electrodes on each of the upstream and downstream sides of the deflection electrodes, selection is made of the shield electrode that is located closest to the deflection electrodes on each of the upstream and downstream sides thereof.

i) Electrical Fields Inside the Deflector 20 Near Shield Electrode

It is preferable that the opening 25A of the shield electrode 25 be formed as small as possible to thereby prevent the electrical fields from leaking to the outside of the deflector 20. Accordingly, a vertical width (y-axis direction width) of the opening 25A of the shield electrode 25 is set substantially equal to the vertical width of the beam.

However, as shown in FIG. 5, under the influence of the deflection electrodes 21 and 22, relatively strong electrical fields are generated, although locally, at edges of the opening 25A of the shield electrode 25. Since the opening 25A is relatively narrow, any beam cannot avoid the electrical fields at the upper and lower edges of the opening 25A.

The beam is directed from the front side toward the back side of the sheet of FIG. 5, wherein the upstream shield electrode 25 is disposed on the front side of the sheet of FIG. 5 and the pair of deflection electrodes 21 and 22 are disposed behind it. If the structure of the deflection electrodes and the distribution of the electrical fields are substantially symmetrical with respect to the y-axis, the electrical fields directed as shown in FIG. 5 are generated near the opening 25A of the upstream shield electrode 25 in an instant when the positive voltage +V is applied to the left deflection electrode 22 and the negative voltage −V is applied to the right deflection electrode 21.

Such electrical fields at the opening 25A of the shield electrode 25 vertically defocus the beam when the beam passes therethrough in a region of x<0 (left side of z-axis), while focus the beam when the beam passes therethrough in a region of 0<x (right side of z-axis). This focus/defocus action is reversed across x=0 on the left and right sides thereof and the magnitude of this action increases as going away from x=0.

Similar electrical fields are also generated at the opening 26A of the downstream shield electrode 26 disposed further behind in FIG. 5.

The electrical fields at the opening of the shield electrode are strong only near the opening of the shield electrode and disappear in a region slightly away from it. This electrical field distribution is generated under the influence of potentials of the deflection electrodes 21 and 22, and the electrical fields generated by the deflection electrodes 21 and 22 are only extremely strong near those electrodes 21 and 22. Therefore, if slightly distanced from the deflection electrodes 21 and 22, the each directionalities of the electrical field distribution hardly changes even by changing the shape of each of the deflection electrodes 21 and 22. However, the strengths of the electrical fields change. That is, in a region slightly distanced from the deflection electrodes 21 and 22, the electrical fields of the same directionalities are constantly generated regardless of whether the deflection electrodes are of the conventional type or the invention type.

ii) Y-Axis Direction (Vertical Direction) Electrical Fields in a Region Inside the Deflector 20 not Near Either of Upstream and Downstream Shield Electrodes In a region inside the deflector 20 and not near either of the upstream and downstream shield electrodes, the electrical fields generated by the deflection electrodes 21 and 22 become dominant. Vertical components of the deflection electrical fields are determined by the shape of each of the concaves 21A and 22A of the deflection electrodes 21 and 22.

Figure 6A:
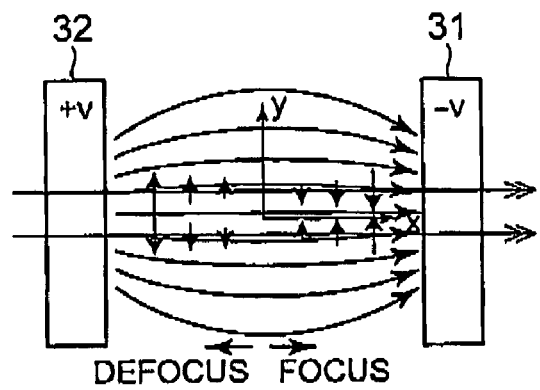
Figure 6B:
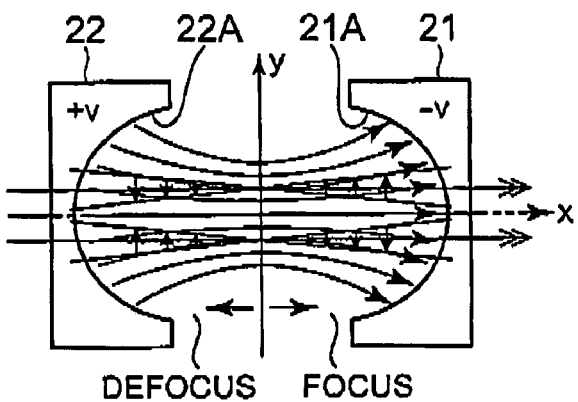

When the positive voltage +V is applied to the left deflection electrode and the negative voltage −V is applied to the right deflection electrode, the electrical field distribution becomes as shown in FIG. 6A or 6B depending on the presence/absence and shape of the concaves.

According to the deflection electrodes 31 and 32 of the conventional type shown in FIG. 6A, electrical fields in the y-axis direction have the same directionality as that of the electrical fields at the opening of the shield electrode in the foregoing item i) to thereby amplify the focus/defocus of the beam in the y-axis direction.

Figure 6C:
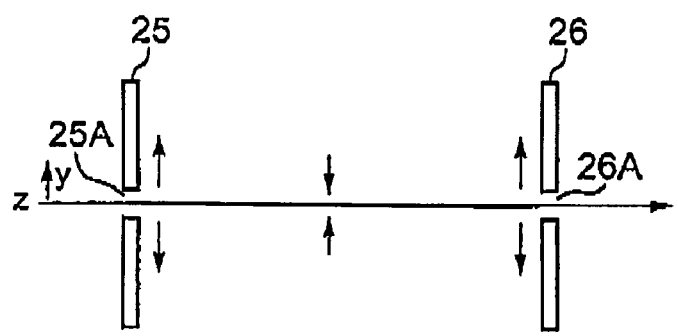

The deflection electrodes 21 and 22 of this invention shown in FIG. 6B are formed with the proper concaves 21A and 22A, respectively. In this case, as shown by arrows in FIG. 6C, electrical fields in the y-axis direction remote from the shield electrodes 25 and 26 have opposite directionalities of the electrical field in the y-axis direction near the openings of the shield electrodes in the foregoing item i). Those electrical fields in the vertical direction are much weaker as compared with the electrical fields near the openings of the shield electrodes but an acting distance range thereof is long, so that the effect of focusing and defocusing become substantially equal to each other in the overall deflector 20.

By determining the shape and size of each of the concaves 21A and 22A of the deflection electrodes 21 and 22 of this invention so that the effect of the electrical fields in the vertical direction in the foregoing items i) and ii) have substantially the same magnitude to thereby cancel each other, the focus/defocus and trajectory declination of the beam in the vertical direction can be suppressed to a small level before and after passing through the deflector 20. Further, it has been confirmed that when the electrical field (particularly the electrical field in a direction perpendicular to the beam deflection plane) at the deflection electrode center portion (the center portion in the z-axis direction) becomes stronger than the electrical fields in the other regions (reverse mode is predominant), a beam profile after passing through the deflector 20 becomes excellent.

Note that the size of each of the concaves 21A and 22A of the deflection electrodes 21 and 22 also affects the leftward/rightward (x-axis direction) beam deflection and thus is optimized by also taking it into account.

As described above, the electrical fields having the directionalities achieved by the deflection electrodes of this invention can deflect the beam more uniformly as compared with the conventional type.

Now, operation will be described.

AC voltages approximate to, phase inverted each other triangular waves, or sawtooth waves, are applied to the two deflection electrodes 21 and 22. The shield electrodes 25 and 26 are provided on the upstream and downstream sides thereof, respectively, i.e. one shield electrode on each of the upstream and downstream sides. Each of the shield electrodes 25 and 26 is grounded. Instead of the ac voltages approximate to phase inverted each other triangular waves or sawtooth waves, use may be made of ac voltages having the same phase and reverse polarity, ac voltages in the form of triangular waves having the same phase and reverse polarity, or as voltages approximate to triangular waves having the same phase and reverse polarity. Alternatively, depending on necessity, use may be made of ac voltages, ac rectangular wave voltages, or ac sine wave voltages having the same values, the same phase, and reverse polarity. DC components may be superimposed on the ac voltages. The scanning frequency (sweep frequency) of the deflection electrodes is set to several tens of Hz to several hundreds of Hz or more and, if circumstances require, may be set to 1 KHz or more.

Although the defocus state (gradient in emittance) of the beam passing through the deflector 20 somewhat changes depending on a deflection angle, the change in defocus state can be made relatively small and thus may be ignored depending on a purpose. In that case, the beam can be deflected only by the deflector of this invention without changing the defocus state of the beam.

In FIG. 1, the beam shaper 13 formed by the Q-lens and so on is provided as a focusing element for forcibly removing the change in defocus state of the beam. The Q-lens may be of an electromagnet type using quadrupole magnets or an electrical field type using quadrupole electrodes. By operating this focusing element synchronously with the application voltage to the deflector 20, the change in defocus state of the beam can be suppressed to a sufficiently small level regardless of the deflection angle. Since the defocus state of the beam changes substantially in proportion to the deflection angle, it is appropriate that a current (in the case of the electromagnet type Q-lens) or a voltage (in the case of the electrical field type Q-lens) to the focusing element be set proportional to the deflection angle.

When there are provided electrodes (P-lens 14 in FIG. 1) for reparallelizing the beam of which the defocus state has been changed by the deflector 20, the change in defocus state is corrected including such reparallelizing electrodes.

The shape of each of the deflection electrodes is not limited to that shown in FIG. 2 and various changes may be made thereto. For example, the cross-sectional shape of the concave formed on each deflection electrode is not limited to the substantially circular-arc shape and may be a polygonal shape including a triangular shape, but is preferably as smooth as possible. Further, each concave may have a shape that changes following z-axis coordinates. Moreover, the surfaces of the concaves may be bent so as to be substantially parallel to the maximum scan trajectory (maximum scan angle range), respectively. For example, the surfaces of the two concaves of the two deflection electrodes may form a space therebetween having a shape that widens toward the downstream side. At any rate, the concave can be implemented by a groove. The concave may be implemented by a hollow cylindrical member with a hollow space defined by a cross-sectional shape of circle, polygonal, or the like, by half cutting along a center axis of the hollow cylindrical member.

Figure 7:
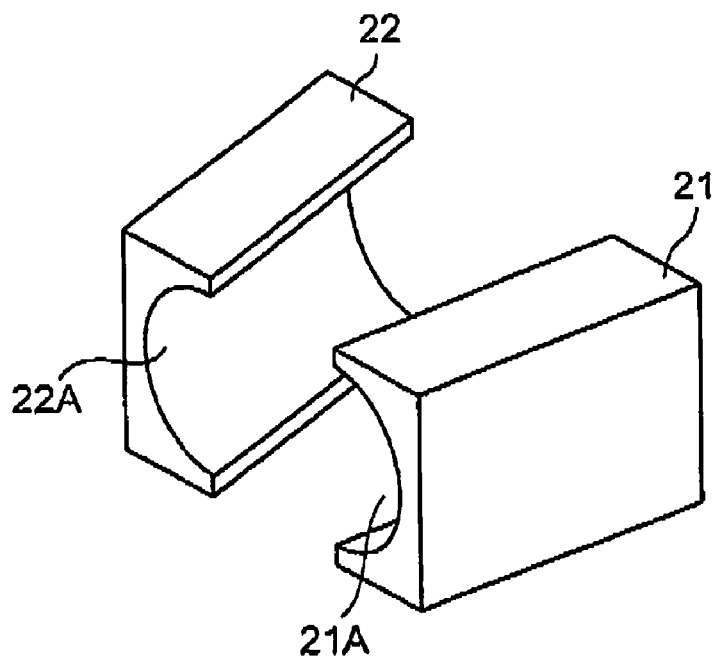
FIG. 7 is a perspective view showing another example of two deflection electrodes according to this invention.
Figure 8:
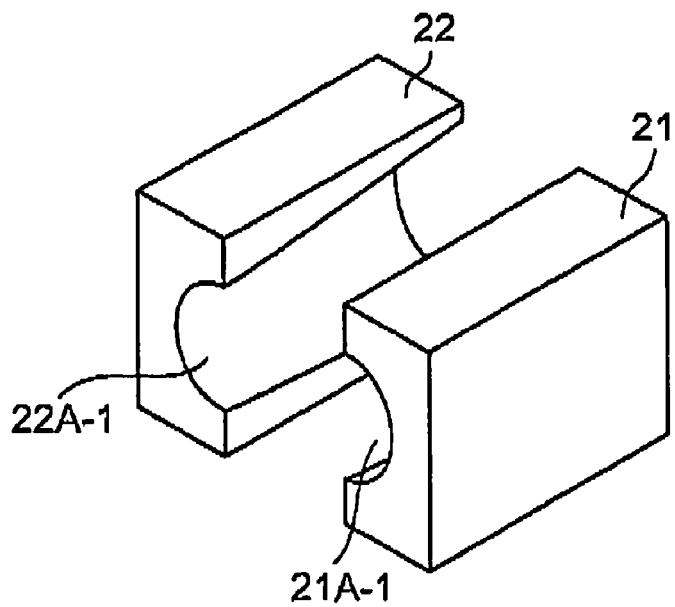
FIG. 8 is a perspective view showing still another example of two deflection electrodes according to this invention.
Figure 9:
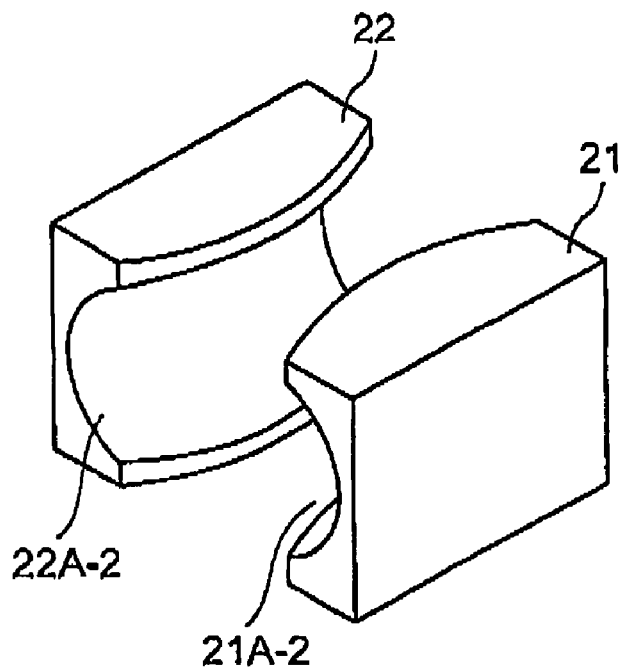
FIG. 9 is a perspective view showing still another example of two deflection electrodes according to this invention.

FIGS. 7 to 9 show examples of concaves of deflection electrodes modified on the basis of the foregoing points.

FIG. 7 shows an example wherein two deflection electrodes 21 and 22 like those shown in FIG. 2 are disposed so that the distance therebetween increases toward the downstream side. This is based on the viewpoint that the deflection electrodes are not required to be parallel with respect to the z-axis (center axis of the beam trajectory), i.e. the center axis of each concave does not necessarily extend in the z-axis direction. However, it is desirable that the two deflection electrodes 21 and 22 be symmetrical with respect to the z-axis.

FIG. 8 shows an example wherein although two deflection electrodes 21 and 22 are disposed in the same manner as in FIG. 2, the radius of the shape of each of concaves 21A-1 and 22A-1 formed on confronting surfaces on the z-axis side of the deflection electrodes 21 and 22, i.e. the radius of a circular-arc cross-sectional shape of each concave, increases toward the downstream side. This is based on the viewpoint that the cross-section of the concave of each deflection electrode as observed in the z-axis direction may be changed along with z-axis coordinates. However, it is desirable that the two deflection electrodes 21 and 22 be symmetrical with respect to the z-axis.

FIG. 9 shows an example wherein each of concaves 21A-2 and 22A-2 formed on confronting surfaces on the z-axis side of two deflection electrodes 21 and 22 has a circular-arc cross-sectional shape in which the depth of the concave changes along with z-axis coordinates so as to be the shallowest at an intermediate portion in the z-axis direction.

Figure 10A:
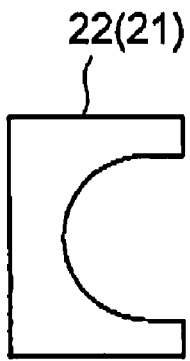
Figure 10B:
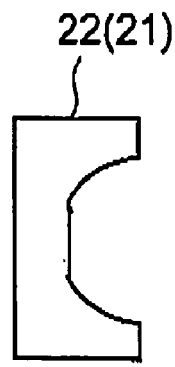

It is needless to say that, as described above, the cross-sectional shape of each concave may also be a polygonal shape including a triangular shape in any of the examples of FIGS. 7 to 9. Further, the cross-sectional shape of each concave may have a circular-arc portion at a deep portion (bottom portion) and an upper and a lower planar portion as shown in FIG. 10A, or the cross-sectional shape of each concave may have a planar portion at a deep portion (bottom portion) and an upper and a lower circular-arc portion as shown in FIG. 10B. Each of the deflection electrodes 21 and 22 may be integrally formed or may be integrally assembled from a plurality of individual members.

Figure 10C:
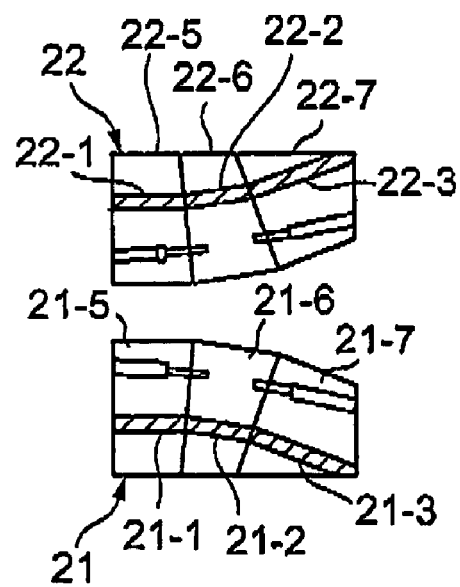

FIG. 10C shows one example wherein each deflection electrode is formed by individual members. Each of deflection electrodes 21 and 22 is composed of three individual members divided in the z-axis direction. The individual members are in the form of semicylindrical members 21-1 (22-1), 21-2 (22-2), and 21-3 (22-3) each obtained by splitting a hollow cylindrical member longitudinally. Further, the semicylindrical members 21-2 (22-2) and 21-3 (22-3) are formed so as to provide a shape that expands toward the downstream side at two-step angles. At upper and lower portions of the semicylindrical members 21-1 (22-1), 21-2 (22-2), and 21-3 (22-3), there are provided base portions 21-5 (22-5), 21-6 (22-6), and 21-7 (22-7) (only the lower side is illustrated) for integrating those semicylindrical members. The base portions are integrated together by the use of joining members such as bolts.

On the other hand, with respect to the shield electrode, it is preferable that the potential can be changed freely. In consideration of focus of the beam and so on, a plurality of shield electrodes may be provided on at least one of the upstream and downstream sides. Alternatively, it may be configured such that two shield electrodes are provided on each of the upstream and downstream sides, the electrode located closer to the deflection electrodes is applied with a dc voltage of about −1 kV to −2 kV so as to serve as a suppression electrode (electron suppression electrode), while the electrode located farther from the deflection electrodes is grounded so as to serve as a ground electrode.

Figure 11:
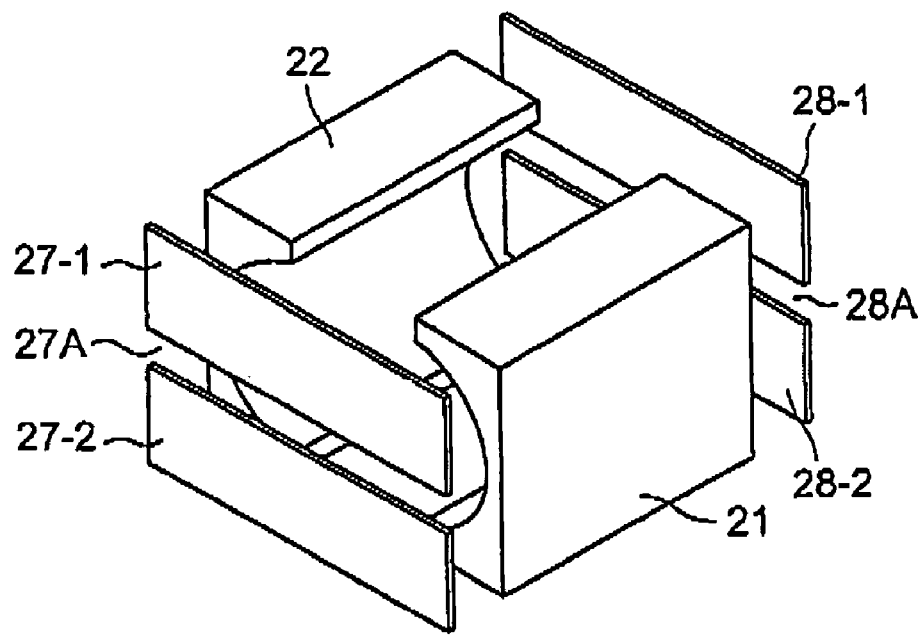
FIG. 11 is a diagram showing another example of shield electrodes in the deflector according to this invention.
Figure 12:
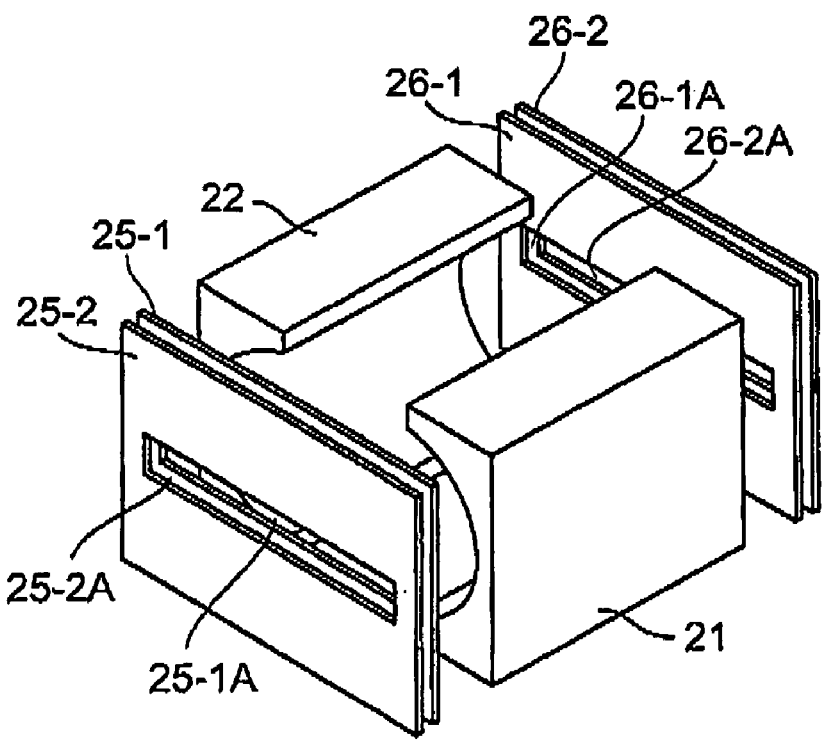
FIG. 12 is a diagram showing still another example of shield electrodes in the deflector according to this invention.

FIGS. 11 and 12 show examples of shield electrodes modified on the basis of the foregoing points.

FIG. 11 shows an example wherein, instead of the shield electrodes each having the opening, two electrode plates 27-1 and 27-2 are arranged side by side with a distance defined therebetween so as to form a beam passing opening 27A and likewise two electrode plates 28-1 and 28-2 are arranged side by side with a distance defined therebetween so as to form a beam passing opening 28A. Naturally, the same voltage is applied to the electrode plates 27-1 and 27-2 and the same voltage is also applied to the electrode plates 28-1 and 28-2.

FIG. 12 shows another embodiment wherein two shield electrodes 25-1 and 25-2 are disposed on the upstream side of the deflection electrodes 21 and 22 and likewise two shield electrodes 26-1 and 26-2 are disposed on the downstream side thereof. It is preferable that each of the shield electrodes can be independently applied with a voltage. As described above, the electrode located closer to the deflection electrodes may be applied with a dc voltage of about −1 kV to −2 kV so as to serve as a suppression electrode, while the electrode located farther from the deflection electrodes may be grounded so as to serve as a ground electrode. The sizes of openings 25-1A and 25-2A of the shield electrodes 25-1 and 25-2 are preferably equal to each other but may be different from each other and likewise the sizes of openings 26-1A and 26-2A of the shield electrodes 26-1 and 26-2 are preferably equal to each other but may be different from each other. Further, each opening may have a shape, other than the substantially rectangular shape, in which upper and lower edges of the opening are curved so that a center portion of the opening becomes narrower as compared with both end portions thereof. In this case, a vertical defocus/focus action against the beam can be adjusted to some degree.

Figure 13:
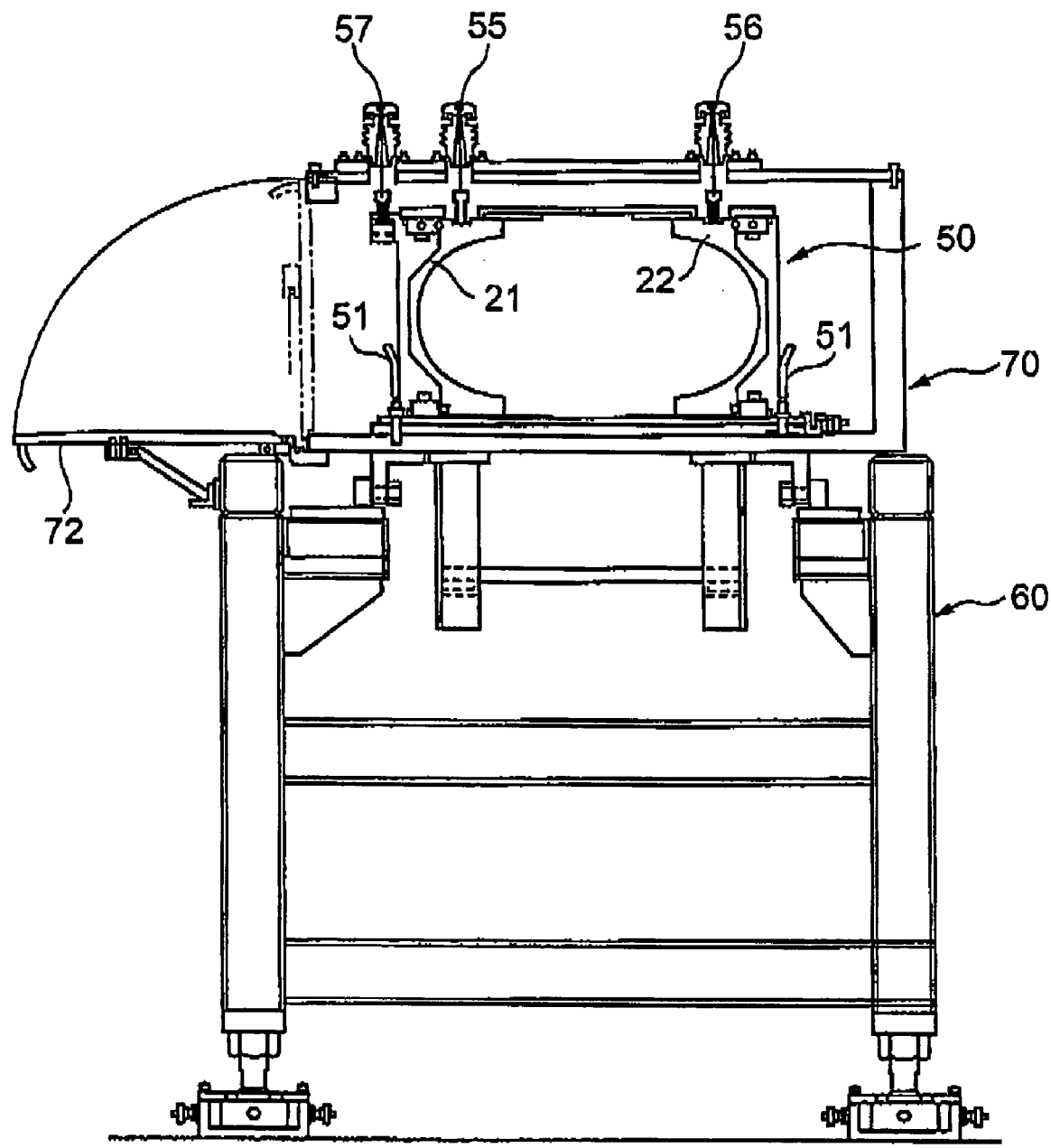
FIG. 13 is a front cross-sectional view, as seen from the downstream side, of a structure wherein the deflector according to this invention is detachably mounted midway in a beam line.
Figure 14:
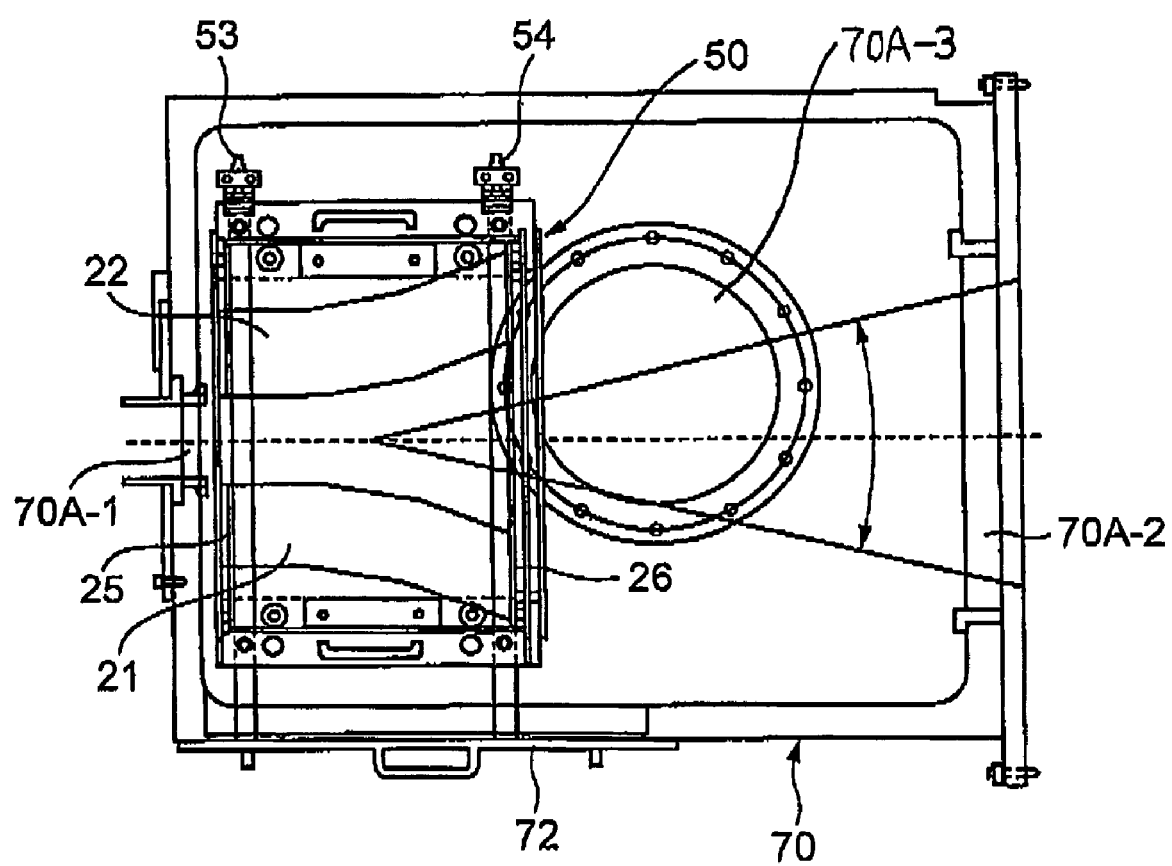
FIG. 14 is a transverse sectional view, as seen from above, of the main part of the structure shown in FIG. 13.
Figure 15:
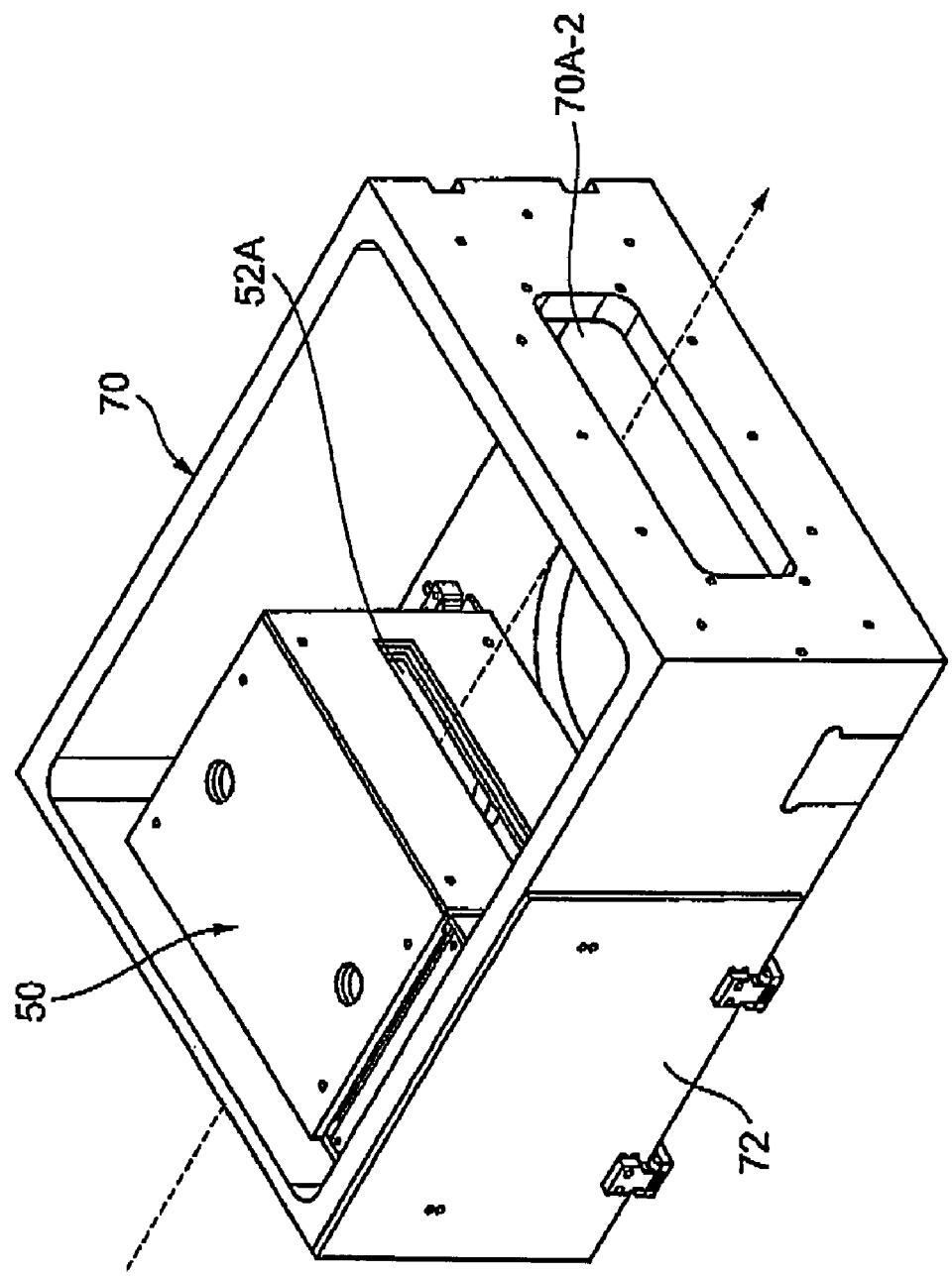
FIG. 15 is a perspective view showing a detachable structure for the deflector according to this invention.
Figure 16:
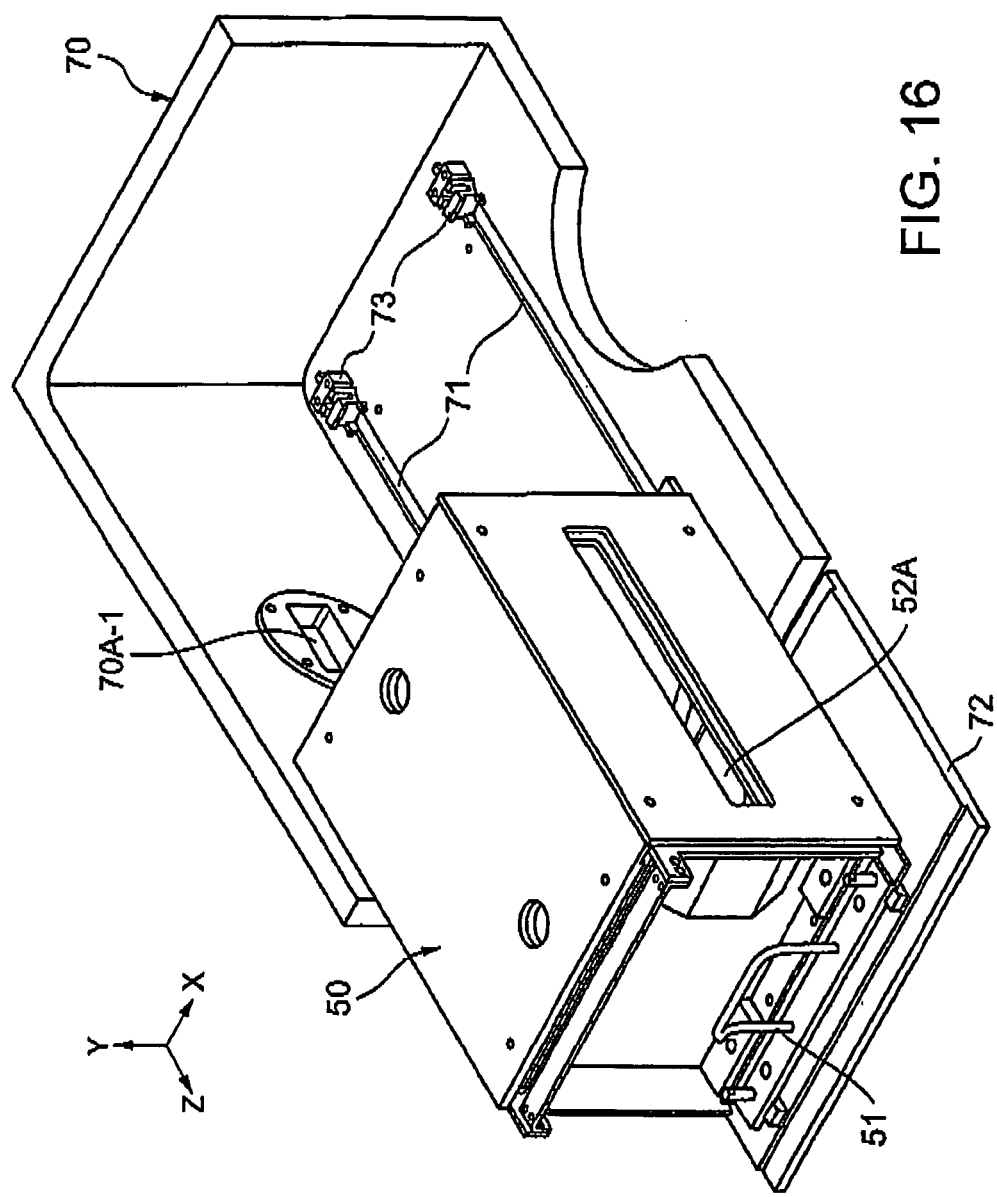
FIG. 16 is a perspective view showing the state where the detachable structure for the deflector according to this invention is on the way to detach the deflector.

Referring now to FIGS. 13 to 16, description will be given about a mounting manner of the deflector according to this invention. FIG. 13 is a front cross-sectional view, as seen from the downstream side, of a structure wherein the deflector is detachably mounted midway in the beam line. FIG. 14 is a transverse sectional view, as seen from above, of the main part of the structure shown in FIG. 13. FIG. 15 is a perspective view showing a detachable structure for the deflector. FIG. 16 is a perspective view showing the state where the detachable structure for the deflector is on the way to detach the deflector.

As shown in FIGS. 14 and 15, the pair of deflection electrodes 21 and 22 and the shield electrodes 25 and 26 mounted near the deflection electrodes 21 and 22 on the upstream and downstream sides thereof are accommodated and disposed within a housing 50. The housing 50 has an upstream wall and a downstream wall. The upstream wall of the housing 50 is formed, at its portion corresponding to the opening 25A of the shield electrode 25, with an upstream opening (not illustrated), while the downstream wall of the housing 50 is formed, at its portion corresponding to the opening 26A of the shield electrode 26, with a downstream opening 52A which is slightly larger than the opening 26A. Connection between the deflection electrodes and a power supply and connection between the shield electrodes and a power supply are realized by a feedthrough structure. Specifically, although not illustrated in FIGS. 15 and 16, the housing 50 has a lateral side where terminals 53 and 54 are provided for connecting the dc power supply to the shield electrodes 25 and 26. On the other hand, the housing 50 has a top side where there are provided terminals 55 and 56 for connecting the power supply to the deflection electrodes 21 and 22 and a terminal 57 for grounding. On two lateral sides, parallel to the center axis of the beam trajectory, of the housing 50 are provided grips 51 which are used for attaching, detaching, or carrying the housing 50. In FIG. 14, symbol 70A-3 denotes an outlet for evacuation carried out for increasing the f degree of vacuum within the deflector and the outlet 70A-3 is connected to an evacuator (not illustrated).

As shown in FIG. 13, the housing 50 is slidably disposed in a beam guide box 70 fixedly mounted on a rack 60. The beam guide box 70 is sufficiently larger than the housing 50. At the bottom of the beam guide box 70, two guide rails 71 are disposed for allowing the housing 50 to be slidable therealong. Each guide rail 71 extends in a direction perpendicular to the center axis of the beam trajectory. The beam guide box 70 has a lateral side that can be opened and closed by a door 72 near one end of each guide rail 71. With this arrangement, the housing 50 can be easily taken out from the beam guide box 70 at the time of maintenance and checkout. In order to lock the housing 50 received in the beam guide box 70, locking mechanisms 73 are provided at the other ends of the guide rails 71. The beam guide box 70 has an upstream wall and a downstream wall that are formed, at their portions corresponding to the upstream opening and the downstream opening 52A of the housing 50, with openings 70A-1 and 70A-2, respectively. The opening 70A-1 does not need to be large because the incident beam trajectory hardly changes. On the other hand, the opening 70A-2 is required to be larger than the opening 52A because the outgoing beam is deflected. Lead wires (not illustrated) are connected to the terminals 53 to 57 but are detached when attaching or detaching the housing 50. At any rate, the housing 50 is configured that it is capable of freely putting on and taking off for the beam line in a midway thereof.

On the other hand, when ions are implanted into a semiconductor wafer having a diameter of, for example, 300 mm by the use of a beam having a flattened cross-sectional shape in which its horizontal width is greater than its vertical width (i.e. having a large diameter) as shown in FIG. 3, the following points are required in the case of using the conventional deflector.

The scan range is wide (e.g. scan angle: 13.5 degree).

The distance L between the deflection electrodes is large (e.g. several hundreds of mm or more).

The beam profile is not distorted even when the scan angle is large.

However, it is practically impossible for the conventional deflector as shown in FIG. 4A to satisfy the foregoing points.

On the other hand, by the use of the deflector according to this invention, it is possible to realize an ion implantation system that can deal with the beam as described above while satisfying the foregoing points.

In the conventional deflector using the simple planar deflection electrodes, when a beam having a large diameter of several tens of mm or more is deflected, the profile of the beam largely and complicatedly changes depending on a change in deflection angle or a position between the deflection electrodes where the beam passes.

On the other hand, in the deflector according to this invention, the deflection electrodes can be designed so that a change in profile of the beam is made as small as possible and orderly with respect to the deflection angle.

In order to prevent leakage of electrical fields, the suppression electrode and the ground electrode are disposed on each of the upstream and downstream sides of the deflection electrodes. In this case, each of the openings of the suppression and ground electrodes is formed into the shape that is large in the horizontal-width direction of the beam while only slightly wider than the vertical width of the beam in the vertical-width direction of the beam so as to well suppress the electrical field, thereby having the rectangular shape with a large aspect ratio. With this arrangement, the suppression and ground electrodes cause the electrical field to be weak in the large-width direction and enable deflection scanning of a beam with a high current density of about 10 mA/cm$^2$ without causing defocus thereof. Further, the size of the overall beam processing system can be the same as the conventional size by the use of the practical and compact deflector.

Moreover, the operation attendant upon maintenance and checkout can be facilitated by allowing the deflector to be attachable and detachable with respect to the beam line.

In view of the foregoing, the deflector according to this invention is suitable for the whole range of beam processing systems that deflect a beam having a relatively large diameter or a beam having a flattened shape, such as an oval shape, in cross-section.

While the present invention has thus far been described in connection with the preferred embodiment thereof, it will readily be possible for those skilled in the art to put this invention into practice in various other manners.

What is claimed is:

1. A beam deflector for scanning and deflecting a charged particle beam, the charged particle beam having a regular trajectory in a vacuum, the deflector comprising:
    a pair of deflection electrodes, wherein each of the electrodes includes an inner surface having a generally symmetrical concave shape relative to each other;
    the inner surfaces of the electrodes being oriented toward one another so as to form an opening, the opening having an axis generally aligned with a direction of a beam trajectory, wherein the beam deflector generates only an electric field to periodically change the trajectory of the charged particle beam.

2. A beam deflector according to claim 1, wherein a cross-sectional shape of said concave shape is a substantially circular-arc concave shape or a polygonal concave shape.

3. A beam deflector according to claim 2, wherein the cross-sectional shape of said concave shape changes linearly or in steps along a center axis of the beam trajectory.

4. A beam deflector according to claim 2, wherein said inner electrode surfaces in said pair of deflection electrodes curve along maximum scan trajectories of a center axis of the beam trajectory so as to be substantially parallel to said maximum scan trajectories.

5. A beam deflector according to claim 1, wherein AC signals having the same phase and reverse polarity are applied to the pair of deflection electrodes, the AC signals being generally in the form of triangular waves having the same phase and reverse polarity.

6. A beam deflector according to claim 1, wherein said pair of deflection electrodes are applied with AC signals having the same values, the same phase, and reverse polarity.

7. A beam deflector according to claim 5 or 6, wherein DC signals are superimposed on said AC signals.

8. A beam deflector according to any one of claims 1 to 4, wherein each of said pair of deflection electrodes is formed by a plurality of individual members that are divided in the direction of a center axis of the beam trajectory.

9. An ion implantation system comprising the beam deflector for scanning according to any one of claims 1 to 6.

10. A beam deflecting method for scanning and deflecting a charged particle beam the charged particle beam having a regular trajectory in a vacuum, said beam deflecting method comprising the steps of:
    preparing, as said beam deflection means for scanning, a pair of deflection electrodes, wherein each of the electrodes includes an inner surface having a generally symmetrical concave shape; the inner surfaces of the electrodes being oriented toward one another so as to form an opening, the opening having an axis generally aligned with a direction of a beam trajectory; and
    applying a generally uniform electric field generated by said pair of deflection electrodes to the charged particle beam passing through the opening defined between said pair of deflection electrodes, thereby performing the deflection for scanning wherein the beam deflection means generate only an electric field to periodically change the trajectory of the charged particle beam.

11. A beam deflecting method for scanning according to claim 10, wherein said pair of deflection electrodes have shapes that form a generally uniform electric field such that a horizontal-width direction of the beam remains generally uniform throughout passage between said pair of deflection electrodes.

12. A beam deflecting method for scanning and deflecting a charged particle beam, the charged particle beam having a regular trajectory in a vacuum, said beam deflecting method far-scanning comprising the steps of:
    preparing a pair of deflection electrodes, wherein each of the electrodes includes an inner surface having a generally symmetrical concave shape; the inner surfaces of the electrodes being oriented toward one another so as to form an opening, the opening having an axis generally aligned with a direction of a beam trajectory; and
    causing the charged particle beam having an oval cross-sectional shape in which a horizontal width of said oval beam parallel to a confronting direction of said pair of deflection electrodes is greater than a vertical width of said oval beam perpendicular to said confronting direction, and said oval beam being incident upon an inlet side of said pair of deflection electrodes; and applying a periodic deflection action for scanning in said confronting direction of said deflection electrode to change the trajectory of the charged particle beam, wherein the pair of deflection electrodes generate only an electric field.

13. A beam deflecting method according to claim 12, wherein the electric field generated by said pair of deflection electrodes is generally uniform, such that the charged particle beam having the oval cross-sectional shape is deflected at substantially the same deflection angle throughout passage between the pair of deflecting electrodes.

14. A beam deflecting method according to claim 13, wherein, in the opening formed between said pair of deflection electrodes, a change in beam profile is made as small as possible and orderly with respect to the deflection angle.

15. A beam deflecting method for scanning and deflecting a charged particle beam, the charged particle beam having a regular trajectory in a vacuum, said beam deflecting method comprising the steps of:

deflecting the charged particle beam for scanning in one scanning direction by the use of a pair of deflection electrodes, wherein each of the electrodes includes an inner surface having a generally symmetrical concave shape; the inner surfaces of the electrodes being oriented toward one another so as to form an opening, the opening having an axis generally aligned with a direction of a beam trajectory;

generating only an electric field to periodically change the trajectory of the charged particle beam; and mechanically moving a substrate, implanted with said charged particle beam, in a direction perpendicular to said one scanning direction to thereby perform ion implantation.

16. An ion implantation method using the beam deflecting method to any one of claims 10 to 15.

17. A beam deflector for scanning and deflecting a charged particle beam, the charged particle beam having a regular trajectory in a vacuum, said beam deflector comprising:

a pair of deflection electrodes, wherein each of the electrodes includes an inner electrode-surface having a generally symmetrical concave shape; the inner surfaces of the electrodes being oriented toward one another so as to form an opening, the opening having an axis generally aligned with a direction of a beam trajectory;

wherein, in order to generate a uniform electric field zone by said deflection electrodes an inlet side of said pair of deflection electrodes are separated at the innermost ends of the inner surface of said deflection electrodes by a width much greater than the horizontal width of the charged particle beam, and wherein the beam deflector generates only an electric field to periodically change the trajectory of the charged particle beam.

18. A beam deflector according to claim 17, wherein a plurality of shield electrodes each have an opening through which the charged particles beam passes are disposed adjacent to said pair of deflection electrodes, least one shield electrode is located upstream of the pair defection electrodes and at least one shield electrode is located downstream of the pair of defection electrodes.

19. A beam deflector according to claim 18, wherein said shield electrodes which are disposed on each of said upstream and downstream sides have plural electrodes, respectively.

20. A beam deflector according to claim 19, wherein each of said shield electrodes is independently applied with one of a fixed voltage and a variable voltage.

21. A beam deflector according to claim 18, wherein a single shield electrode is disposed on each of the upstream and downstream sides of said pair of deflection electrodes and each of the shield electrodes is grounded.

22. A beam deflector according to claim 19, wherein two shield electrodes are disposed on each of the upstream and downstream sides of said pair of deflection electrodes, one of said two shield electrodes on the upstream side, which is located closer to said pair of deflection electrodes, and one of said two shield electrodes on the downstream side, which is located closer to said pair of deflection electrodes, are applied with a voltage of about −1 kV to −2 kV so as to serve as electron suppression electrodes, and the other of said two shield electrodes on the upstream side and the other of said two shield electrodes on the downstream side are grounded so as to serve as ground electrodes.

23. A beam deflector according to claim 22, wherein each of the openings of said suppression and ground electrodes is formed into a rectangular shape with an opening width which is large in a direction of a horizontal beam width and an opening height in a direction of the vertical beam width which is substantially equal to the vertical width of the charged particle beam so as to suppress the electric field from leaking to the outside of the deflector.

24. A beam deflector according to claim 23, wherein said suppression and ground electrodes cause the electrical field to be weak in the direction of the horizontal beam width and have no effect on the trajectory (deflection angle) of the charged particle beam.

25. A beam deflector according to any one of claims 18 to 24, wherein the opening of each of said shield electrodes on the upstream and downstream sides is configured such that the width thereof in a direction of a horizontal beam width is sufficiently greater than the horizontal beam width to thereby prevent the charged particle beam from passing near edges of the opening in the direction of the horizontal beam width.

26. A beam deflector according to claim 18, wherein dimensions of each of the concave shapes of said pair of deflection electrodes are determined such that electric fields in a direction perpendicular to a beam deflection plane near said shield electrodes and the electrical fields in the direction perpendicular to said beam deflection plane within said beam deflector cancel each other, making a focus/defocus and a trajectory declination of the charged particle beam in the direction perpendicular to said beam deflection plane before and after passing through said beam deflector small.

27. A beam deflector according to claim 18, wherein, the electric field in a direction perpendicular to a beam deflection plane at a center portion in said beam deflector is slightly stronger than the electric field outside the center path.

28. A beam deflector according to any one of claims 17 to 24, 26, and 27, wherein each of said pair of deflection electrodes is formed by a plurality of individual members that are divided in the direction of the center axis of the beam trajectory.

29. An ion implantation system comprising the beam deflector according to any one of claims 17 to 24, 26, and 27.

30. An ion implantation system according to claim 9, wherein
said pair of deflection electrodes are disposed in a housing having openings for beam passing; and
said housing is configured to be freely put on and taken off of a beam line in generally the middle of said beam line.

31. An ion implantation system according to claim 30, wherein
a rack is arranged generally in the middle of said beam line,
a beam guide box having beam passing openings and being larger than said housing is mounted on said rack; and
said housing is movable along a rail disposed in said beam guide box so that said housing is allowed to be received into and taken out from said beam guide box.

32. An ion implantation system according to claim 31, wherein said rail extends in a direction perpendicular to an extending direction of the beam line and a door for allowing said housing to be received into and taken out of said beam guide box is provided on one side of said beam guide box near one end of said rail.

33. An ion implantation system according to claim 32, wherein said housing is provided with a plurality of terminals having a feedthrough structure for establishing connection between at least said pair of deflection electrodes and a power supply.

34. An ion implantation system according to claim 30, wherein an outlet connected to an evacuator is provided in said housing.

35. An ion implantation system according to claim 29, wherein
said pair of deflection electrodes are disposed in a housing having openings for beam passing; and
said housing is configured to be freely put on and taken off of a beam line generally in a middle of said beam line.

36. An ion implantation system according to claim 35, wherein
a rack is arranged in the midway of said beam line,
a beam guide box having beam passing openings and being larger than said housing is mounted on said rack; and
said housing is movable along a rail disposed in said beam guide box so that said housing is allowed to be received into and taken out from said beam guide box.

37. An ion implantation system according to claim 36, wherein said rail extends in a direction perpendicular to an extending direction of the beam line and a door for allowing said housing to be received into and taken out of said beam guide box is provided on one side of said beam guide box near one end of said rail.

38. An ion implantation system according to claim 37, wherein said housing is provided with a plurality of terminals having a feedthrough structure for establishing connection between at least said pair of deflection electrodes and a power supply.

39. An ion implantation system according to claim 35, wherein an outlet connected to an evacuator is provided in said housing.

* * * * *